(12) United States Patent
Kim et al.

(10) Patent No.: US 11,216,137 B2
(45) Date of Patent: Jan. 4, 2022

(54) DISPLAY DEVICE HAVING TOUCH SENSOR

(71) Applicant: Samsung Display Co., Ltd., Yongin-Si (KR)

(72) Inventors: Jae Neung Kim, Yongin-si (KR); Chang Yong Jung, Yongin-si (KR); Do Hyun Kwon, Yongin-si (KR); Choong Youl Im, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/750,037

(22) Filed: Jan. 23, 2020

(65) Prior Publication Data
US 2020/0241705 A1    Jul. 30, 2020

(30) Foreign Application Priority Data
Jan. 25, 2019  (KR) .................. 10-2019-0009933

(51) Int. Cl.
*G06F 3/044*    (2006.01)
*G06F 3/041*    (2006.01)
*H01L 51/52*    (2006.01)
*H01L 27/32*    (2006.01)

(52) U.S. Cl.
CPC ........ *G06F 3/0446* (2019.05); *G06F 3/04164* (2019.05); *H01L 27/322* (2013.01); *H01L 27/323* (2013.01); *H01L 27/3246* (2013.01); *H01L 51/5284* (2013.01)

(58) Field of Classification Search
CPC . G06F 3/0446; G06F 3/04164; H01L 27/322; H01L 27/323; H01L 27/3246; H01L 51/5284
See application file for complete search history.

(56) References Cited

U.S. PATENT DOCUMENTS

| | | |
|---|---|---|
| 8,284,332 B2 | 10/2012 | Geaghan et al. |
| 8,970,515 B2 | 3/2015 | Moran et al. |
| 9,478,590 B2 | 10/2016 | Lee |
| 9,823,789 B2 | 11/2017 | Ding et al. |
| 2013/0314342 A1* | 11/2013 | Kim ..................... G06F 3/0443 345/173 |
| 2018/0095567 A1* | 4/2018 | Lee ..................... G06F 3/03547 |

FOREIGN PATENT DOCUMENTS

| | | |
|---|---|---|
| CN | 103970392 A | 8/2014 |
| KR | 10-1397200 B1 | 5/2014 |
| KR | 10-1786119 B1 | 10/2017 |
| KR | 10-2018-0036324 A | 4/2018 |
| KR | 10-2018-0069309 A | 6/2018 |

* cited by examiner

*Primary Examiner* — Robert J Michaud
(74) *Attorney, Agent, or Firm* — Innovation Counsel LLP

(57) ABSTRACT

A display device includes a display panel which includes a plurality of pixels, each of the plurality of pixels including a light emitting region defined by a pixel defining layer; and a touch sensor which is disposed on one surface of the display panel and includes a plurality of sensing electrodes and a plurality of sensing lines connected to the plurality of sensing electrodes. At least two sensing lines are disposed between light emitting regions adjacent to each other.

19 Claims, 11 Drawing Sheets

DISPLAY DEVICE HAVING TOUCH SENSOR

CROSS-REFERENCE TO RELATED APPLICATION

This application claims priority to and the benefit of Korean Patent Application No. 10-2019-0009933 filed in the Korean Intellectual Property Office on Jan. 25, 2019, the entire contents of which are incorporated herein by reference.

BACKGROUND

1. Field

The present inventive concept relates to a display device having a touch sensor.

2. Description of the Related Art

A touch sensor is a device that allows a user to input a command by selecting contents displayed on a screen of a display device or the like using a human hand or an input device. The touch sensor may convert a contact position where the human hand or the input device is in contact into an electrical signal, and an instruction content selected at the contact position may be an input signal to the display device. Accordingly, the display device having the touch sensor may operate without a separate input device such as a keyboard or a mouse.

SUMMARY

An exemplary embodiment of the present inventive concept is to provide a display device including a touch sensor in which sensing electrodes are disposed adjacent to each other to improve touch sensitivity.

According to an aspect of the present inventive concept, there is provided a display device. The display device comprises a display panel which includes a plurality of pixels, each of the plurality of pixels including a light emitting region defined by a pixel defining layer; and a touch sensor which is disposed on one surface of the display panel and includes a plurality of sensing electrodes and a plurality of sensing lines connected to the plurality of sensing electrodes, wherein at least two sensing lines are disposed between light emitting regions adjacent to each other.

In one exemplary embodiment of the present inventive concept, the plurality of sensing lines may be disposed above the pixel defining layer to overlap the pixel defining layer in a plan view.

In one exemplary embodiment of the present inventive concept, the plurality of sensing lines may overlap the pixel defining layer with a capping layer of the display panel interposed between the pixel defining layer and the plurality of sensing lines.

In one exemplary embodiment of the present inventive concept, the plurality of sensing electrodes may include a plurality of first sensing electrode strings and a plurality of second sensing electrode strings alternately arranged in a first direction, the plurality of first sensing electrode strings may be arranged in a second direction different from the first direction and include a plurality of first sensing electrodes connected to a plurality of first sensing lines of the plurality of sensing lines, the second sensing electrode strings may be arranged in the second direction and include a plurality of second sensing electrodes connected to a plurality of second sensing lines of the plurality of sensing lines, the plurality of first sensing electrodes may include a plurality of sub-electrodes arranged in the second direction, and the j-th (j is a natural number smaller than or equal to n) sub-electrode and n−j+1-th sub-electrode among the plurality of first sensing electrodes may be electrically connected to each other through one of the plurality of first sensing lines.

In one exemplary embodiment of the present inventive concept, the number of the plurality of first sensing electrodes included in the first sensing electrode string may be equal to the number of the second sensing electrodes included in the second sensing electrode string.

In one exemplary embodiment of the present inventive concept, the number of the plurality of first sensing electrodes included in the first sensing electrode string may be different from the number of the second sensing electrodes included in the second sensing electrode string.

In one exemplary embodiment of the present inventive concept, two or more of the plurality of first sensing lines or two or more of the second sensing lines may overlap the pixel defining layer disposed between the light emitting regions adjacent to each other.

In one exemplary embodiment of the present inventive concept, the plurality of sensing electrodes may have a mesh structure including openings, and the opening may expose at least a part of the plurality of pixels.

In one exemplary embodiment of the present inventive concept, the plurality of sensing electrodes may have the same area, and each of the plurality of sensing electrodes may be connected one-to-one to the plurality of sensing lines.

In one exemplary embodiment of the present inventive concept, the plurality of sensing electrodes may be arranged in a first direction and in a second direction different from the first direction, and the plurality of sensing electrodes may be connected to pads in a pad portion through the plurality of sensing lines extending between the plurality of sensing electrodes disposed adjacent to each other.

In one exemplary embodiment of the present inventive concept, when n sensing electrodes are arranged in the second direction, a maximum of n sensing lines may be arranged between the light emitting regions adjacent to each other and the color filter layer may include a black matrix that exposes the light emitting region; and a color filter overlapping the light emitting region exposed by the black matrix.

In one exemplary embodiment of the present inventive concept, the display device may further include a color filter layer disposed on the touch sensor, In one exemplary embodiment of the present inventive concept, the black matrix may overlap the pixel defining layer and the sensing lines.

According to an aspect of the present inventive concept, there is provided a display device. The display device comprises a display panel which includes a plurality of pixels, each of the plurality of pixels including a light emitting region defined by a pixel defining layer; and a touch sensor which is disposed on one surface of the display panel, wherein the touch sensor includes a plurality of first sensing electrode strings including a plurality of first sensing electrodes which are arranged in a first direction and connected to a plurality of first sensing lines, respectively; and a plurality of second sensing electrode strings that include a plurality of second sensing electrodes arranged in the first direction and connected to a plurality of second sensing lines, respectively, wherein the plurality of first sensing electrode strings and the plurality of second sensing electrode strings are alternately arranged along a second direction different from the first direction, wherein the plurality of first sensing electrodes include a first plurality of sub-electrodes arranged in the first direction and connected to different first sensing electrodes of the plurality of first sensing electrode, respectively, and wherein the first plurality of sub-electrodes are connected to a second plurality of sub-electrodes disposed adjacent to the first plurality of sub-electrodes in a first direction through the plurality of first sensing lines, and wherein a distance between the plurality of first sensing lines adjacent to each other is different from a distance between the second sensing lines adjacent to each other.

In another exemplary embodiment of the present inventive concept, the distance between the plurality of first sensing lines adjacent to each other may be less than the distance between the second sensing lines adjacent to each other.

In another exemplary embodiment of the present inventive concept, two or more of the plurality of first sensing lines adjacent to each other may be spaced apart from two of more of the plurality of first sensing lines adjacent to each other by the light emitting regions.

In another exemplary embodiment of the present inventive concept, the second sensing lines adjacent to each other may be spaced apart from each other by the light emitting regions adjacent to each other.

In another exemplary embodiment of the present inventive concept, the j-th (j is a natural number smaller than or equal to n) sub-electrode of the plurality of first sensing electrodes adjacent to each other may be electrically connected to the n−j+1-th sub-electrode through one of the plurality of first sensing lines.

The present inventive concept has the following effects.

First, touch sensitivity may be improved since sensing electrodes are disposed adjacent to each other.

Second, touch sensitivity may be improved since an area of the sensing electrode is widened.

DETAILED DESCRIPTION OF THE EMBODIMENTS

Figure 1:
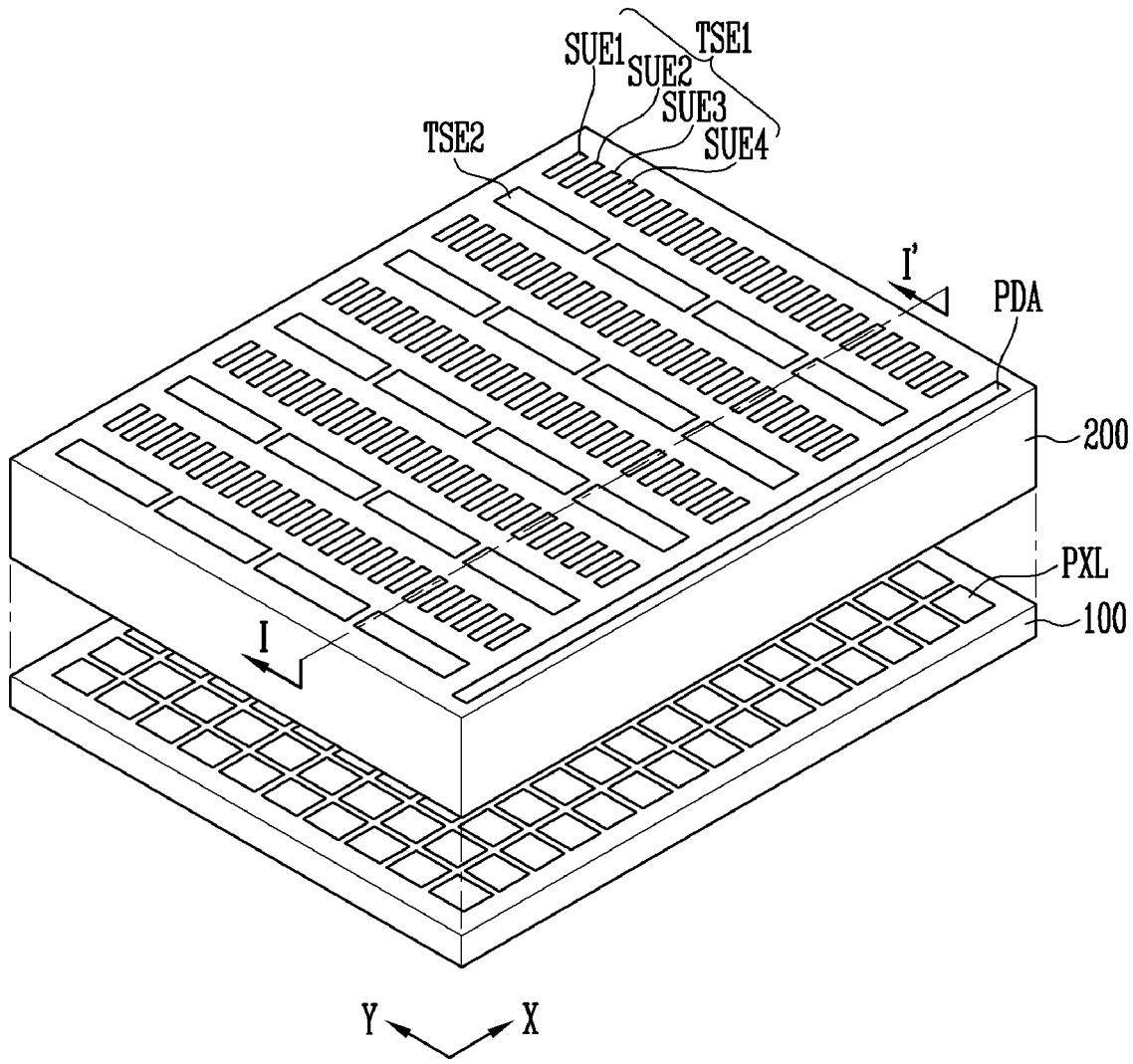
FIG. 1 is a schematic exploded perspective view of a display device having a touch sensor according to one embodiment of the present inventive concept.

Like reference numerals refer to like configuration elements. In the drawings, a thickness, a ratio, and a dimension of a configuration elements are exaggerated for an effective description of the technical content. "and/or" includes all combinations of one or more of which the associated configuration can define.

The terms first, second, and the like may be used to describe various configuration elements, and the configuration elements should not be limited by the terms. The terms are used only for the purpose of distinguishing one configuration element from another configuration element. For example, in a range without departing from the scope of the present inventive concept, the first configuration element may be referred to as a second configuration element, and similarly, the second configuration element may also be referred to as the first configuration element. A singular expression includes plural expressions unless the context clearly dictates otherwise.

In addition, the terms such as "below", "under", "on", "above", and the like are used to describe a relationship between the configurations illustrated in the drawings. The terms are described based on the direction illustrated in the drawing in a relative concept.

It is to be understood that the terms such as "include" and "have" are intended to specify the presence of feature, a number, a step, an operation, a configuration element, and a component, or a combination thereof, and the presence or additionality of one or more other features, numbers, steps, operations, configuration elements, and components, or a combination thereof are not excluded in advance.

Hereinafter, a display device having a touch sensor according to one embodiment of the present inventive concept will be described with reference to the accompanying drawings.

Figure 2:
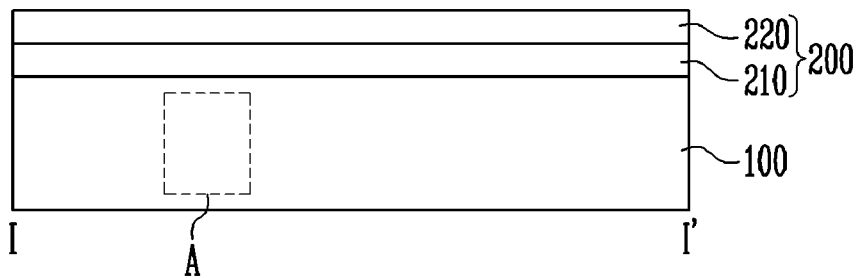
FIG. 2 is a cross-sectional view taken along a line I-I' of FIG. 1.
Figure 3:
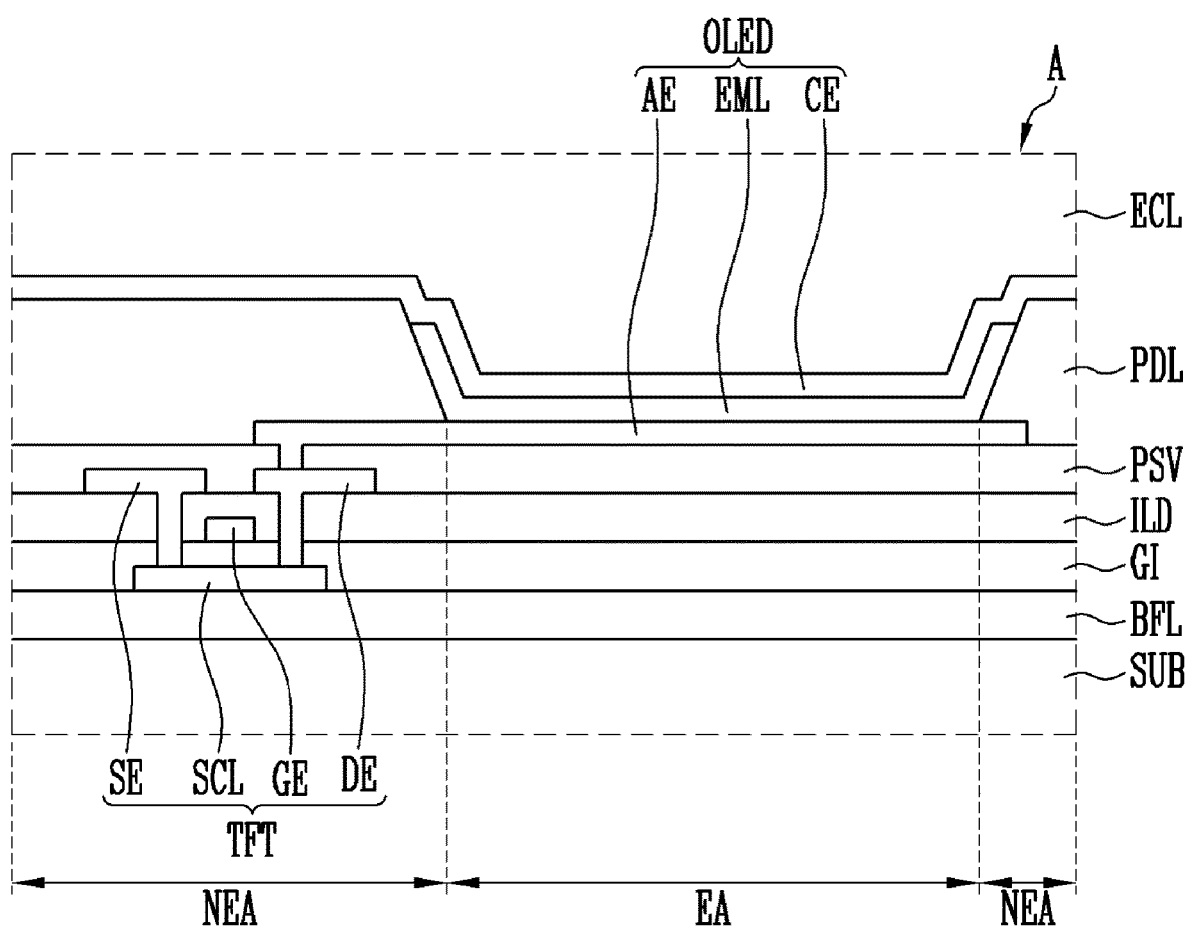
FIG. 3 is an enlarged diagram of a region A illustrated in FIG. 2.

FIG. 1 is a schematic exploded perspective view of a display device having a touch sensor according to one embodiment of the present inventive concept, FIG. 2 is a cross-sectional view taken along a line I-I' of FIG. 1, and FIG. 3 is an enlarged diagram of a region A illustrated in FIG. 2.

As illustrated in FIGS. 1, 2, and 3, the display device having the touch sensor according to the embodiment of the present inventive concept includes a display panel 100 and a touch sensor 200 disposed on one surface of the display panel 100.

The display panel 100 displays an image and is not limited in particular. For example, a self-luminous display panel such as an organic light emitting display panel (OLED panel) may be used as the display panel 100. In addition, a non-luminous display panel such as a liquid crystal display panel (LCD panel), an electro-phoretic display panel (EPD panel), and an electro-wetting display panel (EWD panel) may be used as the display panel 100. When the non-luminous display panel is used as the display panel, the display device may further include a back-light unit that supplies light to the display panel. In the figures, the display panel 100 is illustrated as an organic light emitting display panel.

The display panel 100 may include a substrate SUB and a plurality of pixels PXL provided on the substrate SUB.

The substrate SUB may be a rigid substrate or a flexible substrate. The rigid substrate may include a glass substrate, a quartz substrate, a glass ceramic substrate, and a crystalline glass substrate. The flexible substrate may include a film substrate including a polymeric organic material and a plastic substrate. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

Each of the pixels PXL may include at least one thin film transistor TFT and a display element OLED connected to the thin film transistor TFT. The display element OLED may be an organic light emitting element. The thin film transistor TFT may be disposed in a non-light emitting region NEA of each pixel PXL and the display element OLED may be disposed in the light emitting region EA.

A buffer layer BFL may be disposed between the thin film transistor TFT and the substrate SUB. The buffer layer BFL may include an inorganic insulating material. For example, the buffer layer BFL may include at least one of silicon oxide, silicon nitride, and silicon oxynitride. In addition, the buffer layer BFL may have a single film structure or a multi-film structure. For example, the buffer layer BFL may have a single film structure containing one of the silicon oxide, the silicon nitride, and the silicon oxynitride. The buffer layer BFL may include a silicon oxide film, and a silicon nitride film provided on the silicon oxide film. The buffer layer BFL may include three or more insulating films sequentially stacked.

The buffer layer BFL may prevent impurities from diffusing from the substrate SUB to the thin film transistor TFT. In addition, the buffer layer BFL may also planarize a surface of the substrate SUB.

The thin film transistor TFT may be connected to a gate line (not illustrated) and a data line (not illustrated). The thin film transistor TFT may include a semiconductor layer SCL, a gate electrode GE, a source electrode SE, and a drain electrode DE.

The semiconductor layer SCL may be provided on the buffer layer BFL. The semiconductor layer SCL may include one of amorphous Si, poly crystalline Si, an oxide semiconductor, and an organic semiconductor. In the semiconductor layer SCL, regions connected to the source electrode SE and the drain electrode DE may be a source region and a drain region doped with impurities, respectively. A region between the source region and the drain region may be a channel region.

Although not illustrated, when the semiconductor layer SCL includes an oxide semiconductor, a light shielding film may be further provided for blocking light that is incident on the semiconductor layer SCL on an upper portion or a lower portion of the semiconductor layer SCL.

A gate insulating film GI may be provided on the semiconductor layer SCL. The gate insulating film GI may cover the semiconductor layer SCL and insulate the semiconductor layer SCL from the gate electrode GE. The gate insulating film GI may include at least one of an organic insulating material and an inorganic insulating material. For example, the gate insulating film GI may include at least one of silicon oxide and silicon nitride.

The gate electrode GE may be provided on the gate insulating film GI. The gate electrode GE may be connected to a gate line. The gate electrode GE may include a low-resistance conductive material and overlap the channel region in the semiconductor layer SCL.

An interlayer insulating film ILD may be provided on the gate electrode GE. The interlayer insulating film ILD may include at least one of an organic insulating material and an inorganic insulating material. For example, the interlayer insulating film ILD may include at least one of silicon oxide and silicon nitride. The interlayer insulating film ILD may insulate the source electrode SE, the drain electrode DE, and the gate electrode GE from one another.

Contact holes passing through the gate insulating film GI and the interlayer insulating film ILD may expose a source region and a drain region of the semiconductor layer SCL.

The source electrode SE and the drain electrode DE may be provided on the interlayer insulating film ILD so as to be spaced apart from each other. The source electrode SE and the drain electrode DE may include a low-resistance conductive material. One end of the source electrode SE may be connected to a data line. The other end of the source electrode SE may be connected to the source region through one of the contact holes. One end of the drain electrode DE may be connected to the drain region through the other one of the contact holes. The other end of the drain electrode DE may be connected to the display element OLED to the first electrode AE.

Meanwhile, in the present embodiment, a case where the thin film transistor TFT is a thin film transistor having a top gate structure is described as an example, however, the present inventive concept is not limited thereto. For example, the thin film transistor TFT may be a thin film transistor having a bottom gate structure.

A passivation film PSV may be provided on the thin film transistor TFT on the source electrode SE and the drain electrode DE. The passivation film PSV may cover the thin film transistor TFT. A part of the passivation film PSV may be removed to expose one of the source electrode SE and the drain electrode DE, for example, the drain electrode DE.

The passivation film PSV may include at least one film. For example, the passivation film PSV may include an inorganic passivation film and an organic passivation film provided on the inorganic passivation film. The inorganic passivation film may include at least one of silicon oxide and silicon nitride. The organic passivation film may include one of acryl, polyimide (PI), polyamide (PA), and benzocyclobutene (BCB). In addition, the organic passivation film may be a planarizing film which is transparent and has fluidity, thereby, being able to planarize an uneven surface disposed below the organic passivation film.

The display element OLED may be provided on the passivation film PSV. The display element OLED may include a first electrode AE connected to the thin film transistor TFT, a light emitting layer EML provided on the first electrode AE, and a second electrode CE provided on the light emitting layer EML. Either the first electrode AE or the second electrode CE may be an anode electrode and the other electrode may be a cathode electrode. For example, the first electrode AE may be an anode electrode, and the second electrode CE may be a cathode electrode.

At least one of the first electrode AE and the second electrode CE may be a transmissive electrode. For example, when the display element OLED is a bottom-emission organic light emitting element, the first electrode AE may be a transmission type electrode and the second electrode CE may be a reflection type electrode. When the display element OLED is a top-emission type organic light emitting element, the first electrode may be the reflection type electrode and the second electrode may be a transmission type electrode. When the display element OLED is a double-sided emission type organic light emitting element, both the first electrode AE and the second electrode CE may be a transmission type electrode. In the present embodiment, a case where the display element OLED is the top-emission type organic light emitting element and the first electrode AE is the anode electrode will be described as an example.

In each pixel PXL, the first electrode AE may be provided on the passivation film PSV. The first electrode AE may include a reflective film (not illustrated) capable of reflecting light, and a transparent conductive film (not illustrated) provided on the top or the bottom of the reflective film. At least one of the transparent conductive film and the reflective film may be connected to the drain electrode DE.

The reflective film may include a material capable of reflecting light. For example, the reflective film may include at least one of aluminum (Al), silver (Ag), chromium (Cr), molybdenum (Mo), platinum (Pt), nickel (Ni), and an alloy thereof.

The transparent conductive film may include a transparent conductive oxide. For example, the transparent conductive film may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel definition layer PDL may be provided on the first electrode AE. The pixel definition layer PDL may be provided between adjacent pixels PXL to distinguish each pixel PXL and overlap an edge portion of the first electrode AE of each pixel PXL to define a light emitting region EA and a non-light emitting region NEA of each pixel PXL. Thus, each pixel PXL may include the non-light emitting region NEA which overlaps the pixel defining layer PDL and in which at least one thin film transistor TFT is disposed, and the light emitting region EA in which the first electrode AE is exposed by the pixel defining layer PDL. Light generated in a light emitting layer EML which will be described below may be emitted through the light emitting region EA of each pixel PXL.

The pixel defining layer PDL may include an organic insulating material. For example, the pixel definition layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The light emitting layer EML may be provided on the first electrode AE exposed by the pixel definition layer PDL. The light emitting layer EML may have a multilayer thin film structure including at least a light generation layer LGL. For example, the light emitting layer EML may include a hole injection layer HIL, a hole transport layer HTL, a light generation layer LGL, a hole blocking layer HBL, an electron transport layer ETL, and an electron injection layer EIL. The hole injection layer HIL, the hole transport layer HTL, the hole blocking layer HBL, the electron transport layer ETL, and the electron injection layer EIL may be common films connected to each other in adjacent pixel regions.

The hole injection layer HIL injects holes into the light generation layer, and the electron injection layer EIL injects electrons into the light generation layer. The hole transport layer HTL and the electron transport layer ETL increase a chance of recombination of holes and electrons that are not combined in the light generation layer LGL, and the hole blocking layer HBL suppresses movement of the holes, which are not combined in the light generation layer LGL, to the second electrode CE.

A color of the light generated in the light generation layer may be one of red, green, blue, and white, however, the color of the light generated in the light generation layer is not limited thereto in the present embodiment. For example, the color of the light generated in the light generation layer of the light emitting layer EML may be one of magenta, cyan, and yellow. In addition, the light generation layer may emit white light, and a color image may be realized by using a color filter (not illustrated) disposed corresponding to each pixel PXL.

The second electrode CE may be provided on the light emitting layer EML. The second electrode CE may be a transflective film. For example, the second electrode CE may be a thin metal layer having a thickness enough to transmit light. The second electrode CE may transmit a part of the light generated in the light generation layer and reflect the remainder of the light generated in the light generation layer.

The second electrode CE may include a material having a lower work function than a transparent conductive film. For example, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca) and an alloy thereof.

A part of the light emitted from the light emitting layer EML may not pass through the second electrode CE, and the light reflected by the second electrode CE may be reflected by the reflective film again. That is, the light emitted from the light emitting layer EML may resonate between the reflective film and the second electrode CE. Light extraction efficiency of the display element OLED may be increased by the resonance of light.

A distance between the reflective film and the second electrode CE may differ depending on a color of the light generated in the light generation layer. That is, depending on the color of the light generated in the light generation layer, the distance between the reflective film and the second electrode CE may be adjusted to match a resonance distance.

A capping layer ECL may be provided on the second electrode CE. The capping layer ECL covers the display element OLED, thereby, being able to prevent oxygen and moisture from penetrating into the display element OLED. The capping layer ECL may include a plurality of insulating films. For example, the capping layer ECL may include at least one inorganic film (not illustrated) and at least one organic film (not illustrated).

For example, the capping layer ECL may include a first inorganic film on the second electrode CE, an organic film on the first inorganic film, and a second inorganic film on the organic film. Here, each of the first inorganic film and the second inorganic film may include at least one of silicon oxide, silicon nitride, silicon oxynitride, aluminum oxide, titanium oxide, zirconium oxide, and tin oxide. The organic film may include one of acryl, polyimide, polyamide, and benzocyclobutene (BCB).

Meanwhile, in the present embodiment, a case where the capping layer ECL is applied to isolate the display element OLED from an external environment is described as an example, however, the present inventive concept is not limited thereto. In order to isolate the display element OLED from the external environment, a sealing substrate may be applied instead of the capping layer ECL. The sealing substrate may be bonded to the substrate SUB on which the display element OLED is disposed through a sealant. When the display element OLED is isolated from the external environment using the sealing substrate, the capping layer ECL may be omitted. However, when the display device has foldable characteristics, the display device preferably includes the capping layer ECL such as an inorganic film or an organic film instead of the sealing substrate.

The touch sensor 200 may be disposed on the display panel 100 described above. The touch sensor 200 may include an electrode layer 210 provided on the capping layer ECL and a cover layer 220 disposed on the electrode layer 210. The electrode layer 210 may be directly disposed on the capping layer ECL of the display panel 100 instead of using a separate substrate.

Hereinafter, a relationship between the electrode layer 210 of the touch sensor and the light emitting region EA of the pixel will be described with reference to the accompanying drawings.

Figure 4:
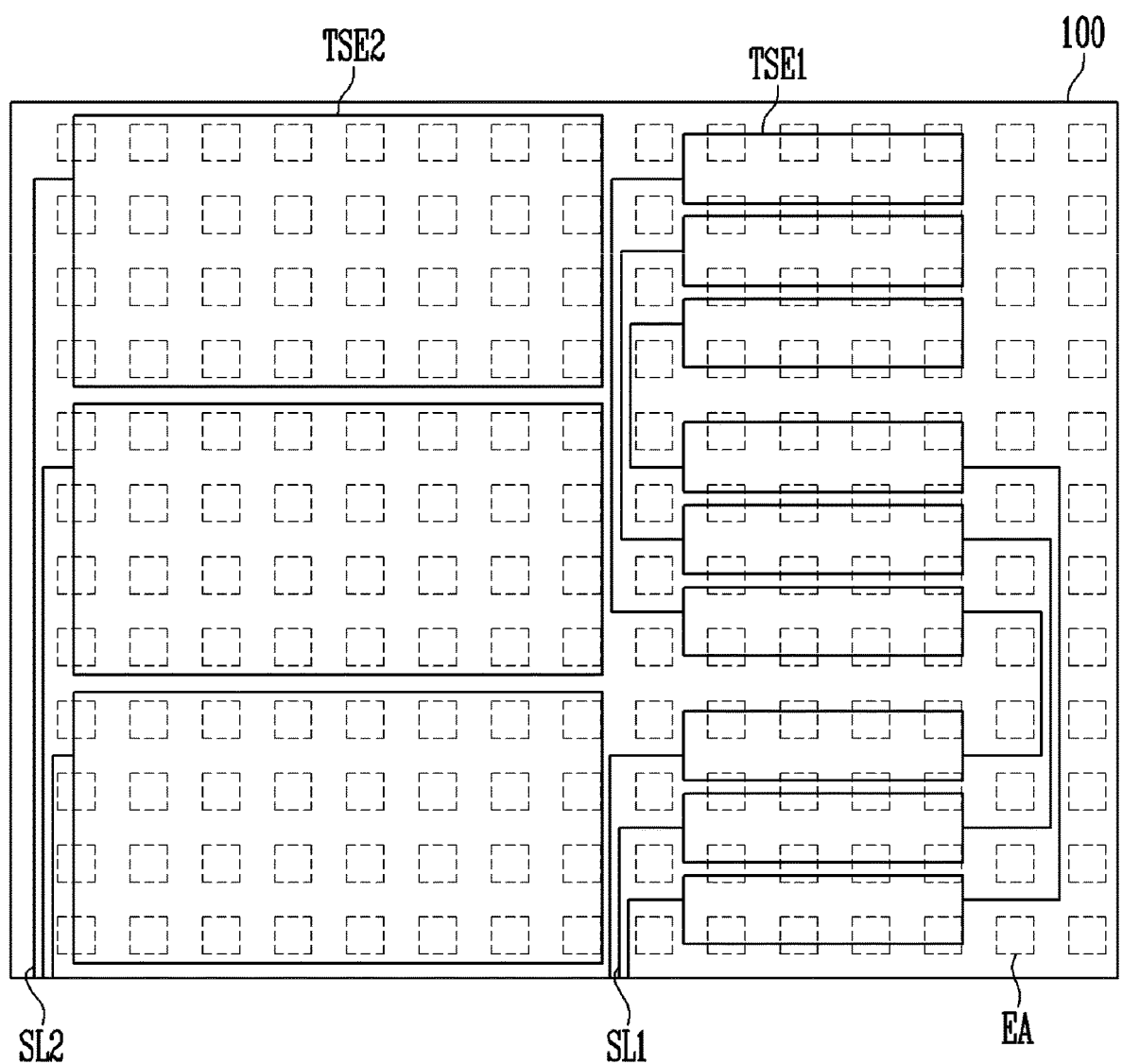
FIG. 4 is a schematic plan view illustrating a relationship between an electrode layer of the touch sensor and a light emitting region of a pixel, according to the embodiment of the present inventive concept.

FIG. 4 is a schematic plan view illustrating the relationship between the electrode layer of the touch sensor and the light emitting region of the pixel according to the embodiment of the present inventive concept.

As illustrated in FIG. 4, the electrode layer (see 210 of FIG. 2) of the touch sensor may include a plurality of sensing electrodes TSE1 and TSE2 and a plurality of sensing lines SL1 and SL2 that connect the plurality of sensing electrodes TSE1 and TSE2 to a pad portion (see PDA of FIG. 1). At least two sensing lines of the plurality of sensing lines SL1 and SL2 may be disposed between adjacent light emitting regions EA.

Hereinafter, structure of the sensing electrodes TSE1 and TSE2 and the sensing lines SL1 and SL2 will be described in detail with reference to the accompanying drawings.

Figure 5A:
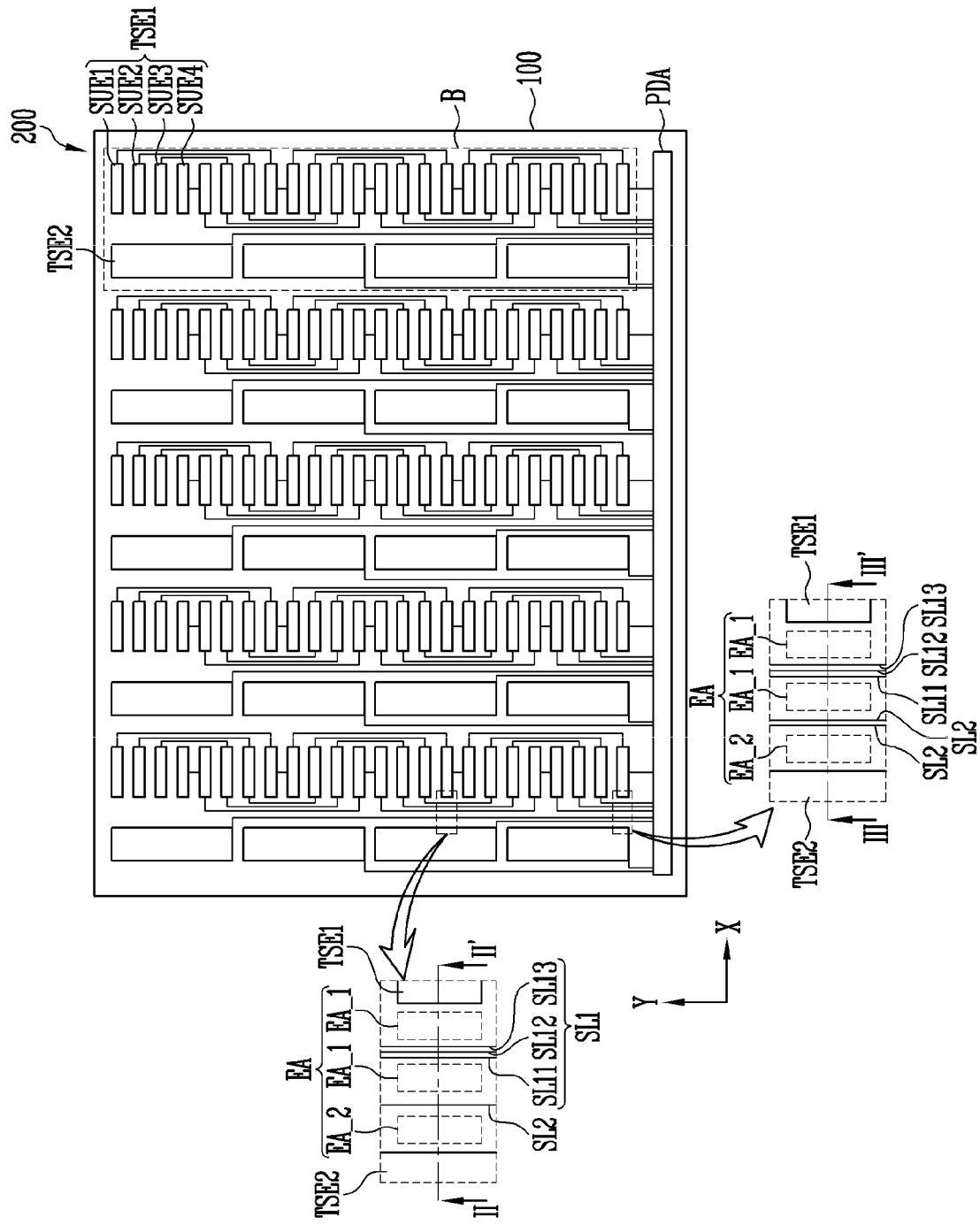
FIG. 5A is a plan view of a touch sensor disposed on a display panel of FIG. 1.
Figure 5B:
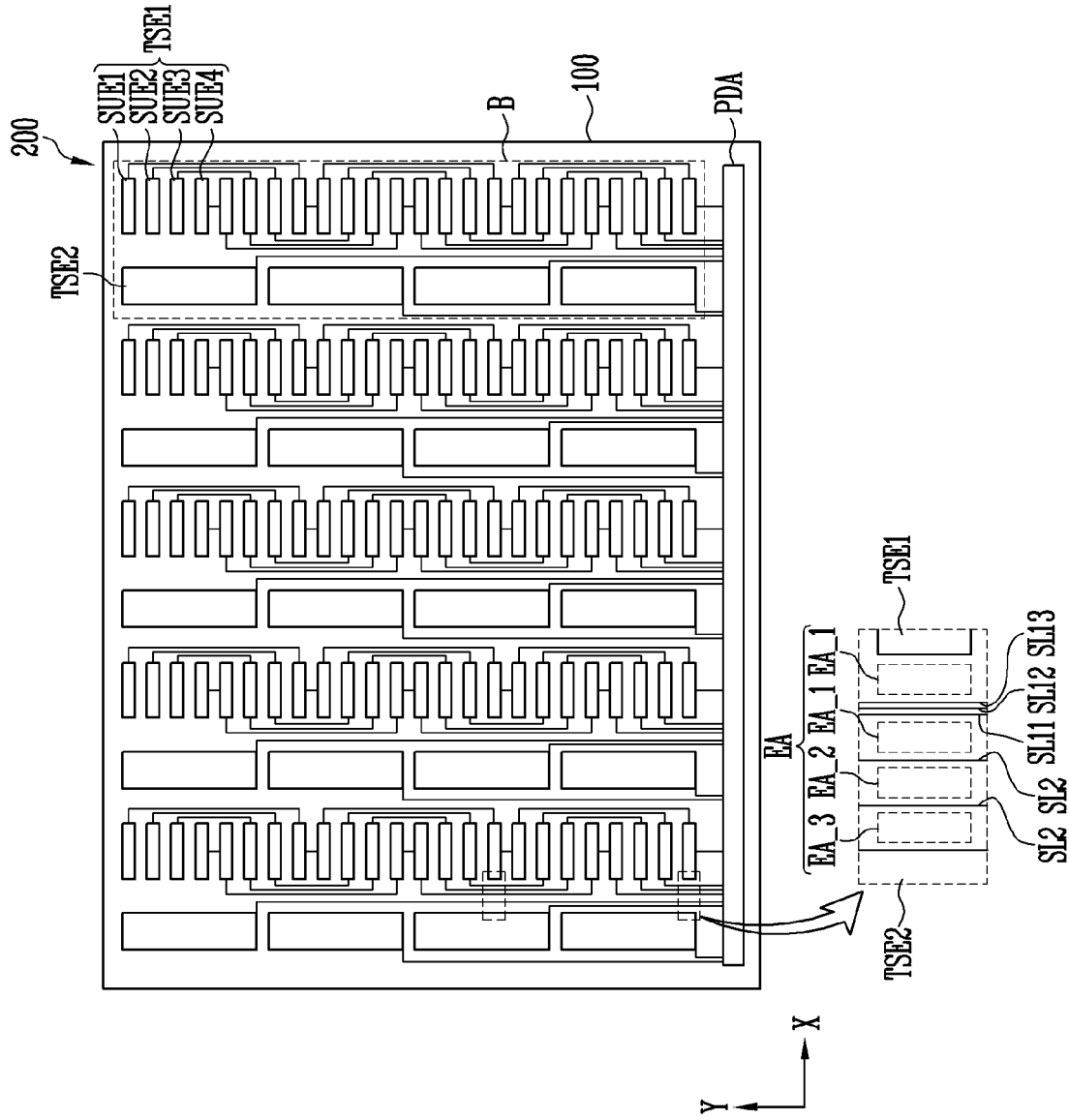
FIG. 5B is a plan view of a touch sensor according to another embodiment disposed on the display panel of FIG. 1.
Figure 6A:
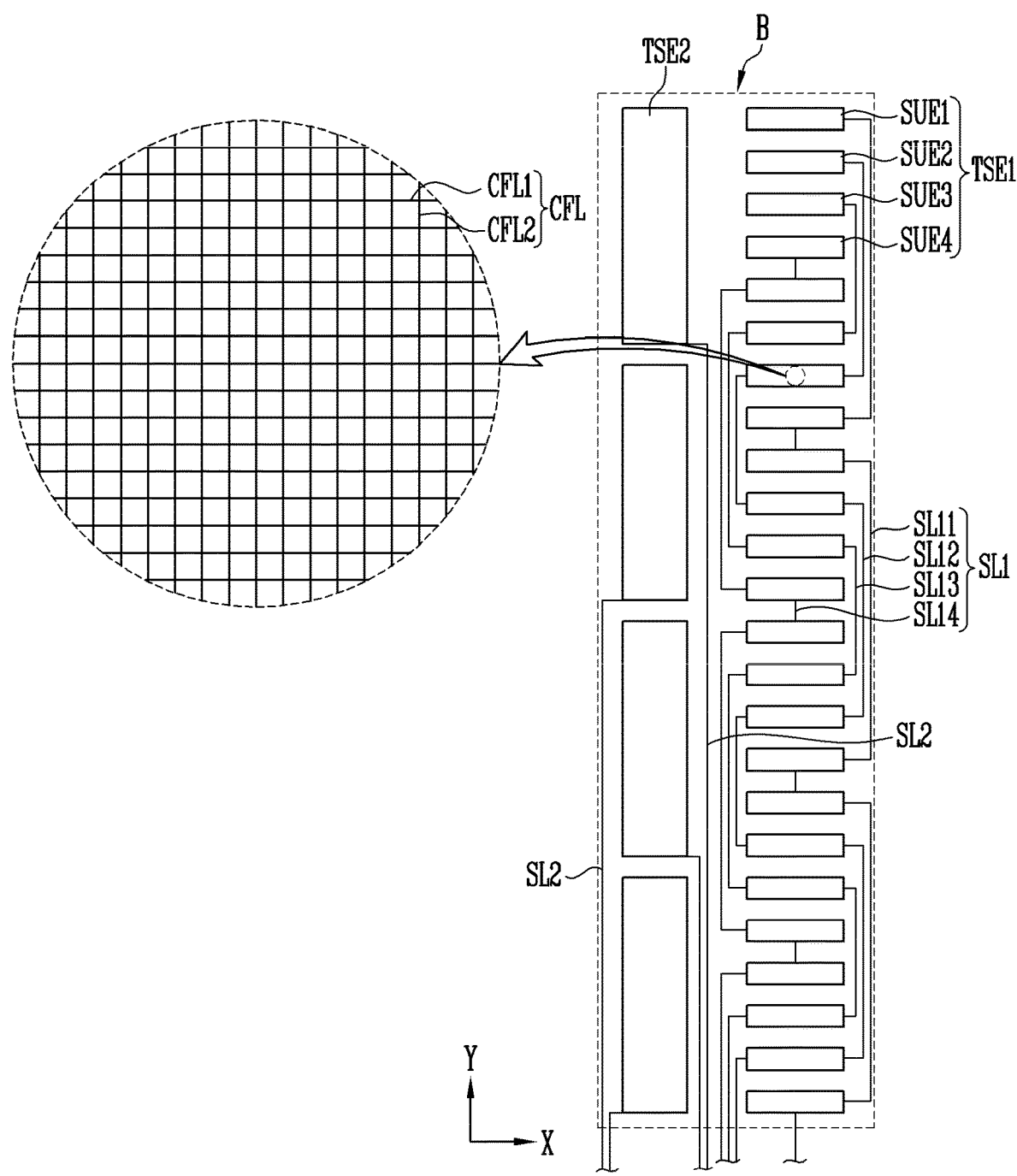
FIG. 6A is an enlarged diagram of a region B illustrated in FIG. 5A.
Figure 6B:
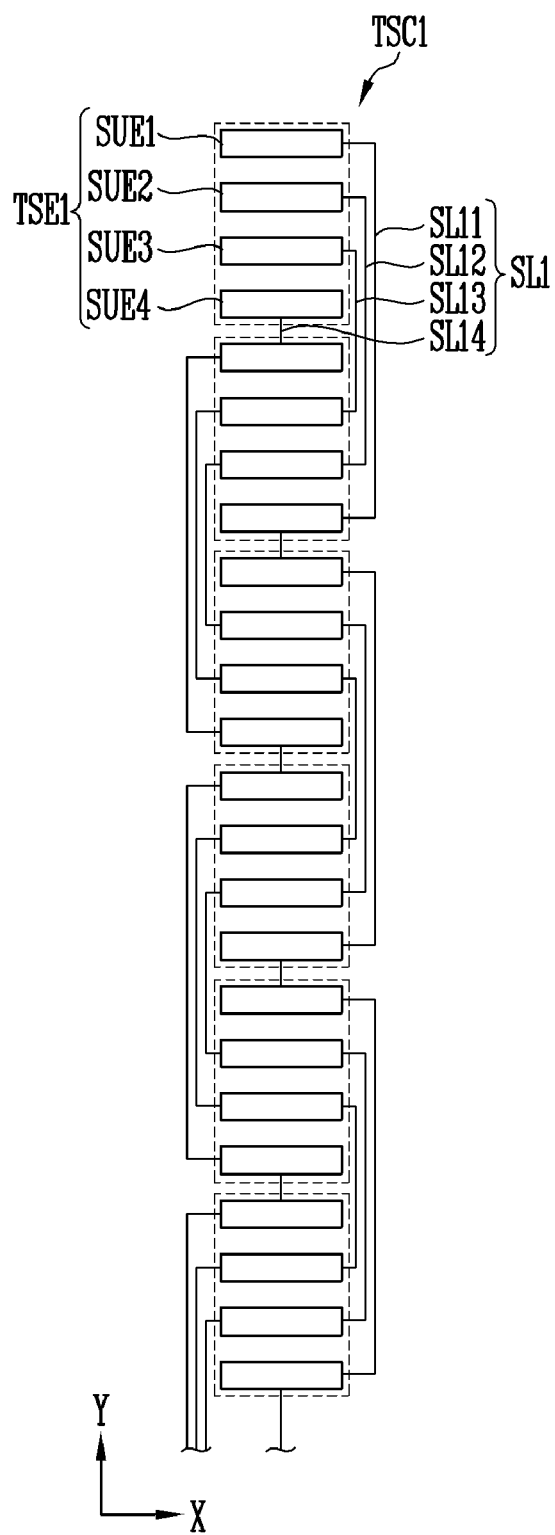
FIG. 6B is a plan view illustrating first sensing electrodes and first sensing lines of a first sensing electrode string illustrating in FIG. 6A.
Figure 6C:
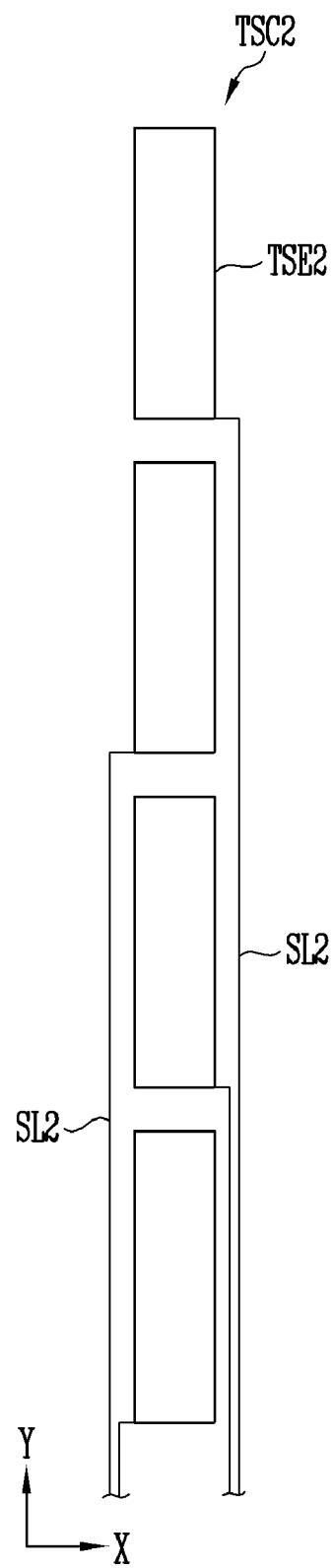
FIG. 6C is a plan view illustrating second sensing electrodes and second sensing lines of a second sensing electrode string illustrated in FIG. 6B.

FIG. 5A is a plan view of the touch sensor disposed on the display panel of FIG. 1, and FIG. 5B is a plan view of a touch sensor according to another embodiment disposed on the display panel of FIG. 1. FIG. 6A is an enlarged view of a region B illustrated in FIG. 5A. FIG. 6B is a plan view illustrating the first sensing electrodes and the first sensing lines of the first sensing electrode string illustrated in FIG. 6A, and FIG. 6C is a plan view illustrating the second sensing electrodes and the second sensing lines of the second sensing electrode string illustrated in FIG. 6B.

As illustrated in FIGS. 5A, 5B, 6A, 6B, and 6C, The electrode layer (see 210 of FIG. 2) of the touch sensor 200 may include a plurality of first sensing electrode strings TSC1, a plurality of second sensing electrode strings TSC2, a plurality of first sensing lines SL1 connected between the plurality of first sensing electrode strings TSC1 and corresponding pads in a pad portion PDA, a plurality of second sensing lines SL2 connected between the plurality of second sensing electrode strings TSC2 and corresponding pads in a pad portion PDA. The pad portion PDA electrically connects the plurality of first sensing electrode strings TSC1 and the plurality of second sensing electrode strings TSC2 to an external drive circuit (not illustrated) through the first sensing lines SL1 and the second sensing lines SL2. The pad portion PDA overlaps a non-display region of the display panel 100 so as not to overlap the pixels (see PXL of FIG. 1) of the display panel 100.

The first sensing electrode string TSC1 and the second sensing electrode string TSC2 may be alternately disposed in a first direction X. When a user touches the display panel, the touch may be detected through a change in amount of mutual capacitances formed between the first sensing electrode string TSC1 and the second sensing electrode string TSC2.

First, the first sensing electrode string TSC1 will be described as follows.

The first sensing electrode string TSC1 may include a plurality of first sensing electrodes TSE1 extending in a first direction X and arranged in a second direction Y different from the first direction X. The figure illustrates that the first sensing electrode string TSC1 includes six first sensing electrodes TSE1. The first sensing electrodes TSE1 may include a plurality of sub-electrodes SUE1, SUE2, SUE3, and SUE4 spaced apart in the second direction Y. FIGS. 5A, 5B, 6A, and 6B illustrate that one first sensing electrode TSE1 includes four sub-electrodes SUE1, SUE2, SUE3, and SUE4, however, the present inventive concept is not limited thereto. The first sub-electrode SUE1 of the first sensing electrode TSE1 may be disposed farthest from the pad portion PDA, and the fourth sub-electrode SUE4 may be disposed closest to the pad portion PDA.

The sub-electrodes SUE1, SUE2, SUE3, and SUE4 may be connected to the first sensing lines SL1. The first sensing lines SL1 may connect the sub-electrodes SUE1, SUE2, SUE3, and SUE4 of one first sensing electrode TSE1 to the sub-electrodes SUE1, SUE2, SUE3, SUE4 of another first sensing electrode TSE1.

If the first sensing electrodes TSE1 include n sub-electrodes SUE1, SUE2, SUE3, SUE4, . . . , SUEN, j-th (j is a natural number smaller than or equal to n) sub-electrode of the first sensing electrode TSE1 may be electrically connected to the n−j+1-th sub-electrode of the adjacent first sensing electrode TSE1 through the j-th first sensing line SL1. Accordingly, if the number of the sub-electrodes SUE1, SUE2, SUE3, and SUE4 included in the first sensing electrode TSE1 is n, the first sensing lines SL1 corresponding to one first sensing electrode string TSC1 may be n.

For example, as illustrated, if each of the first sensing electrodes TSE1 includes four sub-electrodes SUE1, SUE2, SUE3, and SUE4, the first sub-electrode SUE1 of one first sensing electrode TSE1 may be electrically connected to the fourth sub-electrode SUE4 of the adjacent first sensing electrode TSE1 through the $1^{st}$ first sensing line SL11. The second sub-electrode SUE2 of one first sensing electrode TSE1 may be electrically connected to the third sub-electrode SUE3 of the adjacent first sensing electrode TSE1 through the $2^{nd}$ first sensing line SL12.

The third sub-electrode SUE3 of one first sensing electrode TSE1 may be electrically connected to the second sub-electrode SUE2 of the adjacent first sensing electrode TSE1 through the $3^{rd}$ first sensing line SL13. Finally, the fourth sub-electrode SUE4 of one first sensing electrode TSE1 may be electrically connected to the first sub-electrode SUE1 of the adjacent first sensing electrode TSE1 through the $4^{th}$ first sensing line SL14. Accordingly, the number of the first sensing lines SL1 corresponding to each of the first sensing electrode strings TSC1 may be four.

However, the first sensing lines SL1 and the first sensing electrodes TSE1 may be connected in various ways without being limited to the above-described connection method.

For example, the sub-electrodes of the first sensing electrode TSE1 may also be connected to the pad portion PAD through separate first sensing lines SL1.

The sub-electrodes SUE1, SUE2, SUE3, and SUE4 may have a mesh structure. The mesh structure includes a plurality of conductive fine lines CFL, and for example, the mesh structure may include first conductive fine lines CFL1 and second conductive fine lines CFL2 intersecting the first conductive fine lines SFL1.

The first conductive fine lines CFL1 and the second conductive fine lines CFL2 may overlap the pixel defining layer PDL of the display panel 100 in a plan view. Openings formed by the first conductive fine lines CFL1 and the second conductive fine lines CFL2 may expose the respective pixels (see PXL of FIG. 1) of the display panel 100, specifically, light-emitting layers (see EA of FIG. 3) of the respective pixels (see PXL of FIG. 1).

Accordingly, areas where the sub-electrodes SUE1, SUE2, SUE3, and SUE4 overlap the display panel 100 are reduced, and at the same time, the first sensing electrodes TSE1 are prevented from overlapping the pixels (see EA of FIG. 3) of the display panel 100, more specifically, the light emitting regions (see EA of FIG. 3) of the pixels (see PXL of FIG. 1), and thereby, it is possible to prevent the light emitted from the light emitting region (see EA of FIG. 3) of the display panel 100 from overlapping the electrode layer 210 of the touch sensor 200.

Each of the first conductive fine line CFL1 and the second conductive fine line CFL2 may include at least one of aluminum (Al), copper (Cu), chromium (Cr), nickel (Ni), gold (Au), platinum (Pt), and an alloy thereof. In addition, each of the first conductive fine line CFL1 and the second conductive fine line CFL2 may include a transparent conductive oxide.

Although not illustrated, the first sensing lines SL1 may have a mesh structure too. The first sensing lines SL1 are arranged to overlap the pixel defining layer PDL of the display panel 100 in a plan view, that is, the non-light emitting region (see NEA of FIG. 5A) of the display panel 100 such that the light emitted from the display panel 100 may not be blocked by the first sensing lines SL1. The pad portion PDA may be connected to the first sensing electrodes TSE1.

Next, the second sensing electrode string TSC2 will be described as follows.

The second sensing electrode strings TSC2 may be arranged alternately with the first sensing electrode strings TSC1 in the first direction X, and each of the second sensing electrode strings may include a plurality of second sensing electrodes TSE2 extending in the second direction Y.

One second sensing electrode string TSC2 may include q (q is a natural number larger than or equal to 2) second sensing electrodes TSE2. As illustrated in the figure, the second sensing electrode string TSC2 may include a plurality of second sensing electrodes TSE2 arranged in the second direction Y. For example, as illustrated in FIGS. 5A, 5B, 6A, and 6C, the second sensing electrode string TSC2 may include four second sensing electrodes TSE2, however, the number of the second sensing electrode string TSC2 is not limited thereto.

Each of the second sensing electrodes TSE2 may be connected to the respective second sensing lines SL2. Accordingly, the number of the second sensing lines SL2 corresponding to one second sensing electrode string TSC2 may be equal to the number of the second sensing electrodes TSE2. That is, the number of the second sensing lines SL2 corresponding to one second sensing electrode string TSC2 may be q. The second sensing lines SL2 may be disposed at a region between the second sensing electrode strings TSC2 and the first sensing electrode strings TSC1. In addition, the second sensing lines SL2 may be alternately arranged on a left side and a right side of the second sensing electrode strings TSC2.

At this time, the second sensing electrodes TSE2 may also have a mesh structure, thereby, minimizing areas where the second sensing electrodes TSE2 overlap the display device. The second sensing lines SL2 may also be arranged to overlap the pixel defining layer PDL of the display panel 100, that is, the non-light emitting region (see NEA of FIG. 3) of the display panel 100 such that the light emitted from the display panel 100 may not be blocked by the second sensing lines SL2. The pad portion PDA may be connected to the second sensing electrodes TSE2. In addition, the second sensing lines SL2 may also have a mesh structure.

A selected one of the first sensing electrodes TSE1 and the second sensing electrodes TSE2 may be a touch drive electrode for receiving a touch drive signal, and the other may be a touch reception electrode for outputting a touch sensing signal. Accordingly, the electrode layer 210 may detect a touch of a user through a change in amount of mutual capacitances formed between the first sensing electrodes TSE1 and the second sensing electrodes TSE2.

In the figure, the number of the first sensing electrodes TSE1 included in one first sensing electrode string TSC1 and the number of the second sensing electrodes TSE2 included in one second sensing electrode string TSC2 are different from each other. As illustrated in FIG. 6A, each of the first sensing electrode strings TSC1 includes six first sensing electrodes TSE1, and each of the second sensing electrode strings TSC2 includes four second sensing electrodes TSE2. However, the number of sensing electrodes included in each sensing electrode string is not limited thereto and may be altered. For example, the number of the first sensing electrodes TSE1 included in one first sensing electrode string TSC1 may be equal to the number of the second sensing electrodes TSE2 included in one second sensing electrode string TSC2.

A thickness of a window (not illustrated) or the like that may be disposed on the touch sensor 200 may be thinly formed such that a display device including the touch sensor 200 may be folded. In this case, a distance between the touch sensor 200 and a user hand or an input device is shortened. The shortened distance causes a mutual capacitance generated between the sensing electrodes TSE1 and TSE2 to be influenced by a mutual capacitance generated between the hand of the user or the input device and the sensing electrode TSE1 and TSE2, and thereby, a problem that touch sensitivity is reduced occurs. Accordingly, the foldable display device needs to have a narrower interval between the first sensing electrode TSE1 and the second sensing electrode TSE2 than a general display device.

Since the first sensing lines SL1 and the second sensing lines SL2 are disposed between the first sensing electrodes TSE1 and the second sensing electrodes TSE2, there is a limit in narrowing the intervals between the first sensing electrodes TSE1 and the second sensing electrodes TSE2. In particular, since the general display device includes the first sensing lines SL1 and the second sensing lines SL2 disposed above the pixel defining layer PDL between the adjacent pixels PXL, and thus, as the number of the first sensing lines SL1 and the second sensing lines SL2 increases, the intervals between the first sensing electrodes TSE1 and the second sensing electrodes TSE2 increase.

Accordingly, in one embodiment of the present inventive concept, the first sensing lines SL1 and the second sensing lines SL2 are disposed adjacent to each other between the first sensing electrodes TSE1 and the second sensing electrodes TSE2, and thereby, the intervals between the first sensing electrodes TSE1 and the second sensing electrodes TSE2 are narrowed.

Specifically, as illustrated in FIG. 5A, the first sensing lines SL1 adjacent to each other and the second sensing lines SL2 adjacent to each other may be disposed between a first adjacent light emitting regions EA_1 and a second adjacent light emitting regions EA_2 which is different from the first adjacent light emitting regions EA_1, respectively. For example, only the first sensing lines SL1 adjacent to each other may be disposed between the first adjacent light emitting regions EA_1 and the second sensing lines SL2 adjacent each other may be disposed between the second adjacent light emitting regions EA_2 different from the first adjacent light emitting regions EA_1. In FIG. 5B, the three first sensing lines SL1 adjacent to each other are disposed between the first adjacent light emitting regions EA_1, the two second sensing lines SL2 adjacent to each other are disposed between a second adjacent light emitting regions EA_2 and a third adjacent light emitting regions EA_3, respectively, and thereby, the sensing lines are spaced apart from each other with the adjacent light emitting regions EA interposed therebetween.

Accordingly, in FIG. 5B, a distance between the first sensing lines SL1 adjacent to each other is different from a distance between the second sensing lines SL2 adjacent to each other, and specifically, the distance between the first sensing lines SL1 adjacent to each other is less than the distance between the second sensing lines SL2 adjacent to each other.

Conversely, although not illustrated, only the second sensing lines SL2 adjacent to each other may be disposed between the light emitting regions EA adjacent to each other, and each of the first sensing lines SL1 adjacent to each other may be disposed at different locations between the light emitting regions EA adjacent to each other. In this case, the distance between the second sensing lines SL2 adjacent to each other is less than the distance between the first sensing lines SL1 adjacent to each other.

Hereinafter, a structure in which each of the first sensing lines SL1 adjacent to each other and the second sensing lines SL2 adjacent to each other is disposed between the light emitting regions EA adjacent to each other will be specifically described as follows with reference to the accompanying drawings.

Figure 7A:
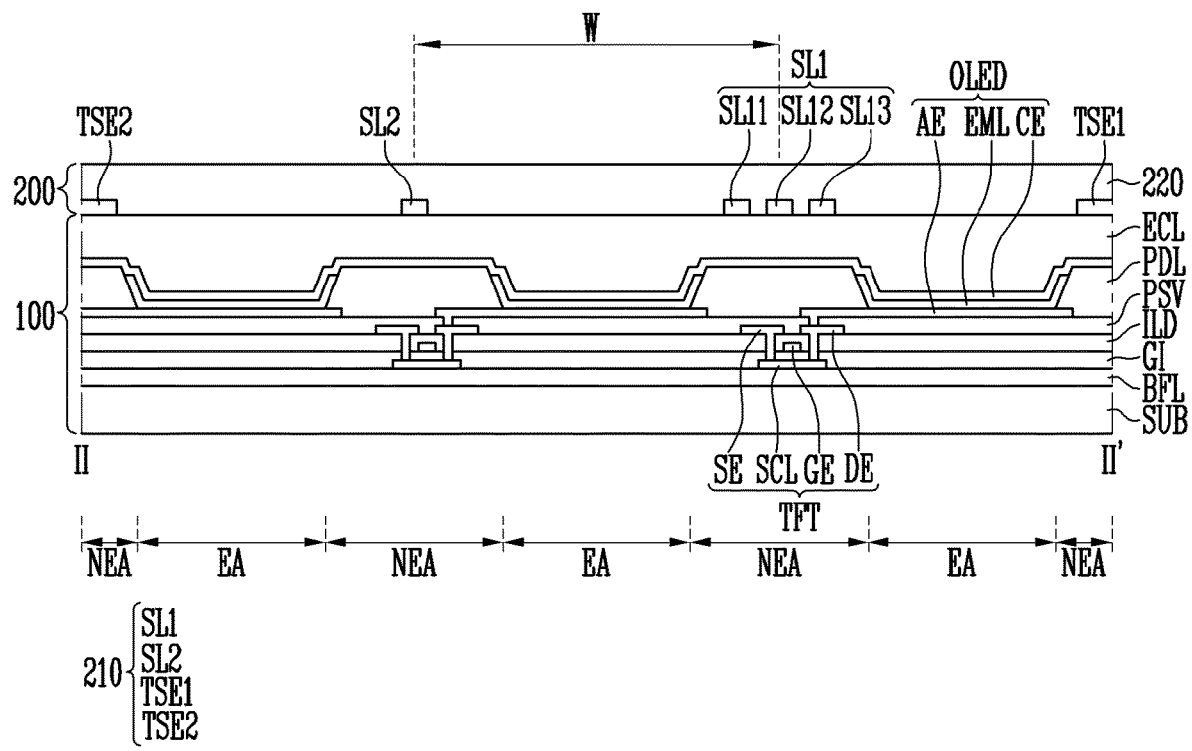
FIG. 7A is a cross-sectional view of a line II-II' of FIG. 5A.
Figure 7B:
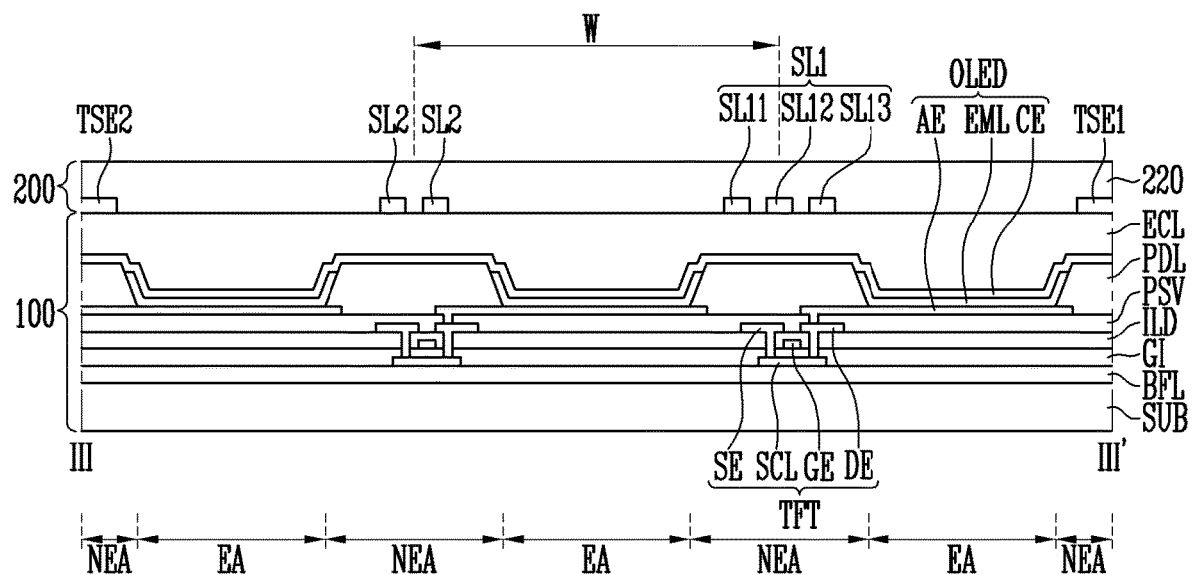
FIG. 7B is a cross-sectional view of III-III' of FIG. 5A.

FIG. 7A is a cross-sectional view taken along a line II-II' of FIG. 5A, and FIG. 7B is a cross-sectional view taken along a line III-III' of FIG. 5A. The display panel 100 is further illustrated in FIGS. 7A and 7B.

As illustrated in FIG. 7A, the touch sensor 200 disposed on the display panel 100 overlaps the pixel defining layer PDL of the display panel 100 to expose the light emitting region EA of the display panel 100, such that the first and second sensing lines SL1 and SL2 connected to the first and second sensing electrodes TSE1 and TSE2 does not block the light emitted from the display panel 100. In the figure, the first and second sensing lines SL1 and SL2 are disposed between the light emitting regions EA adjacent to each other with the capping layer ECL of the display panel 100 interposed between the capping layer ECL and the first and second sensing lines SL1 and SL2 so as to overlap the pixel defining layer PDL.

At least two sensing lines among the first sensing lines SL1 and the second sensing lines SL2 (SL11, SL12 and SL13) are arranged side by side on a part of the pixel defining layer PDL disposed between adjacent the light emitting regions EA, and thereby, the first sensing lines SL1 and the second sensing lines SL2 may arranged close to each other. The figure illustrates that three first sensing lines SL1 (SL11, SL12 and SL13) are arranged side by side above the pixel defining layer PDL between the adjacent pixels.

In a conventional touch sensor, only one sensing line among the first sensing lines SL11, SL12 and SL13 and the second sensing lines SL2 are disposed above the pixel defining layer PDL which is disposed between adjacent light emitting regions EA, and each of the first sensing lines SL11, SL12 and SL13 and the second sensing lines SL2 are spaced apart from each other with at least one pixel (see PXL of FIG. 1) interposed therebetween. Accordingly, as the number of the sensing lines SL1 and SL2 increases, intervals between the first sensing electrodes TSE1 and the second sensing electrodes TSE2 increase. However, in the embodiment of the present inventive concept, at least two of the adjacent sensing lines SL1 and SL2 are disposed above the same pixel defining layer PDL.

Referring to FIG. 7A, an interval between the first sensing line SL1 and the second sensing line SL2, which are disposed between the first sensing electrodes TSE1 and the second sensing electrodes TSE2, is similar to a width W of one pixel (see PXL of FIG. 1).

For example, if the three adjacent first sensing lines SL11, SL12, and SL13 are all spaced apart by the width W of one pixel, the first sensing electrode TSE1 and the second sensing electrode TSE2 disposed in the first direction X are spaced apart by widths of five pixels (see PXL of FIG. 1). However, by disposing side by side the three adjacent first sensing lines SL11, SL12, and SL13 above a same pixel defining layer PDL between the light emitting regions EA adjacent to each other as in the embodiment of the present inventive concept, the first sensing electrode TSE1 and the second sensing electrode TSE2 disposed in the direction X may be spaced apart from each other by widths of only three pixels (see PXL of FIG. 1).

In addition, as illustrated in FIG. 7B, the two adjacent second sensing lines SL2 may also be disposed side by side above the pixel defining layer PDL between the light emitting regions EA adjacent to each other. In this case, the three first sensing lines SL1 and the two second sensing lines SL2 may be spaced apart by the width W of only one pixel (see PXL of FIG. 1). In this case, a distance between the three adjacent first sensing lines SL1 is equal to a distance between the two adjacent second sensing lines SL2.

Therefore, in the embodiment of the present inventive concept, intervals between the first sensing electrodes TSE1 and the second sensing electrodes TSE2 are reduced by disposing two or more sensing lines among the first sensing lines SL11, SL12, SL13 and the second sensing lines SL2 above the same pixel defining layer PDL disposed between adjacent light emitting regions EA. Accordingly, it is possible to increase the number of the first sensing electrodes TSE1 and the second sensing electrodes TSE2 or to increase areas of the first sensing electrodes TSE1 and the second sensing electrodes TSE2.

Figure 7C:
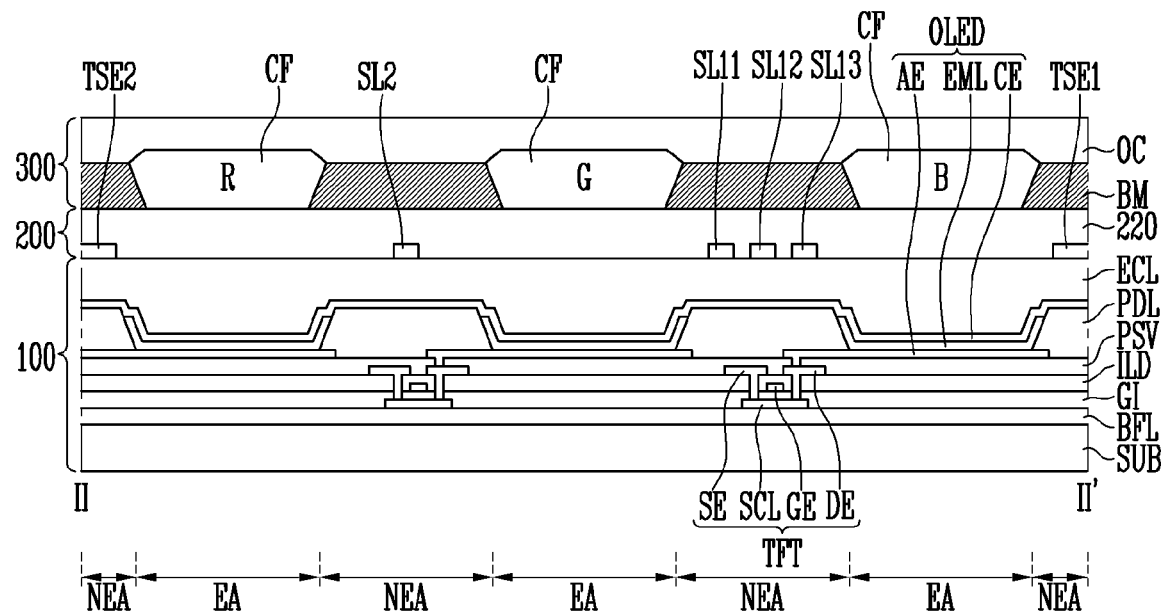
FIG. 7C is a view of FIG. 7A to which a color filter is added.

FIG. 7C is a view of FIG. 7A to which a color filter is added.

As illustrated in FIG. 7C, a color filter layer 300 may be further disposed on the touch sensor 200. In this case, the color filter layer 300 is formed on the touch sensor 200 without interposing an additional substrate, and thereby, a process may be simplified and cost may be reduced.

Specifically, the display device according to another embodiment of the present inventive concept may include the display panel 100 including the plurality of pixels (see PXL of FIG. 1), the touch sensor 200 disposed on the display panel 100, and the color filter layer 300 disposed on the touch sensor 200. The color filter layer 300 may be directly disposed on a cover layer 220 of the touch sensor 200.

In a conventional display device, a substrate of the display panel 100 on which the pixels (see PXL of FIG. 1) are formed is bonded to a substrate on which the color filter layer 300 is formed. However, when the touch sensor 200 is disposed on the display panel 100 and the color filter layer 300 is disposed on the touch sensor 200 as illustrated in FIG. 7C, the display device includes only one substrate SUB of the display panel 100, and thereby, the degree of freedom of design is increased and the display device may be easily folded. In addition, resolution and an aperture ratio of the display device may be increased by securing a space of a bonding alignment tolerance.

A black matrix BM is disposed to overlap the pixel defining layer PDL of each pixel (see PXL of FIG. 1), that is, the light emitting region EA of the display panel 100 is exposed by the black matrix BM. The black matrix BM prevents light interference and light leakage between the adjacent pixels (see PXL of FIG. 5A), and the black matrix BM prevents the electrode layer 210 and the like of the touch sensor 200 from being visible on the display device.

A color filter CF may be disposed in the light emitting region EA exposed by the black matrix BM. As in the embodiment of the present inventive concept, the color filter CF is a red (R), green (G) and blue (B) color filters. White light emitted from the display element OLED may be changed to red, green and blue light by the red (R), green (G) and blue (B) color filters, respectively, and thereby, each pixel (see PXL of FIG. 1) may implement a color image through a color filter CF.

An overcoat layer OC may be disposed on the black matrix BM and the color filter CF for planarizing the color filter layer 300. The overcoat layer OC may prevent the touch sensor 200 and the display panel 100 from being damaged by external moisture or the like, and the overcoat layer OC may be formed of an organic insulating film, an inorganic insulating film or the like. Although not illustrated, a polarization plate or the like may be further disposed on the overcoat layer OC.

When the display device includes the color filter layer 300 as described above, the sensing lines SL of the touch sensor 200 are disposed between the pixel defining layer PDL between the adjacent pixels (see PXL of FIG. 1) of the display panel and the black matrix BM of the color filter layer 300. At least two sensing lines SL overlap a region where the pixel defining layer PDL and the black matrix BM overlap.

Figure 8:
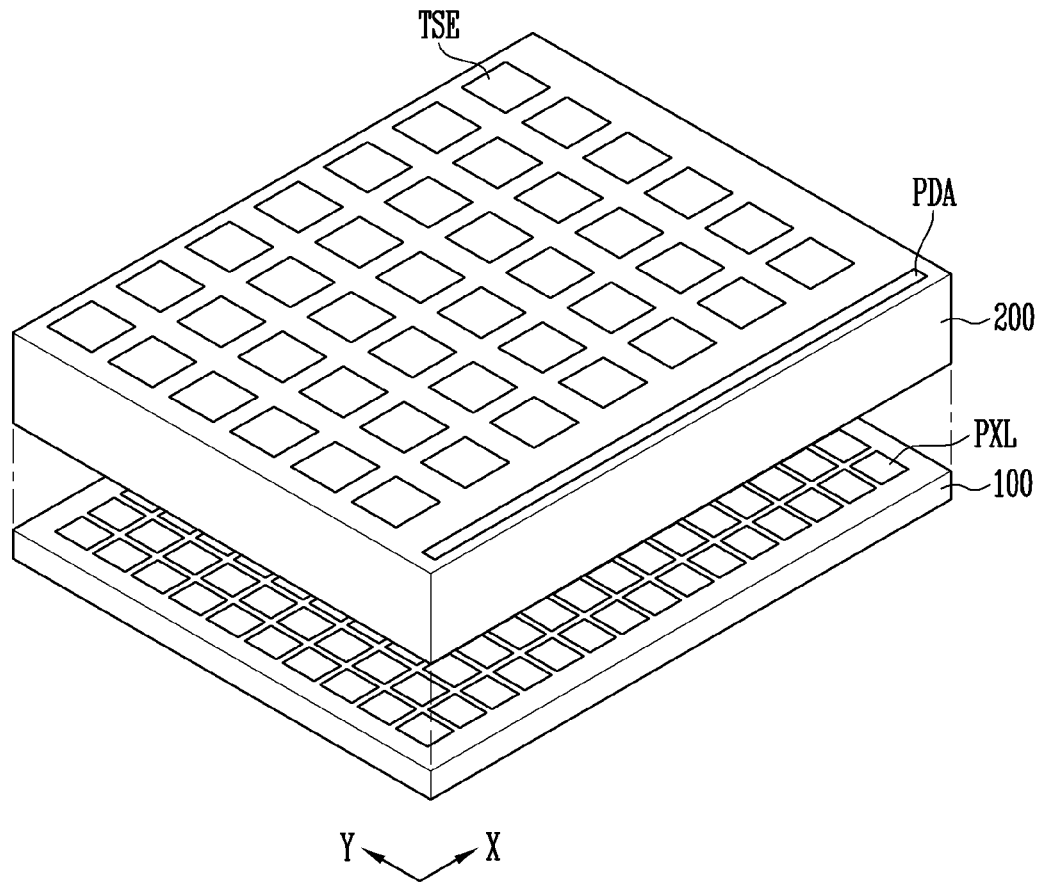
FIG. 8 is a schematic exploded perspective view of a display device having a touch sensor according to another embodiment of the present inventive concept.
Figure 9:
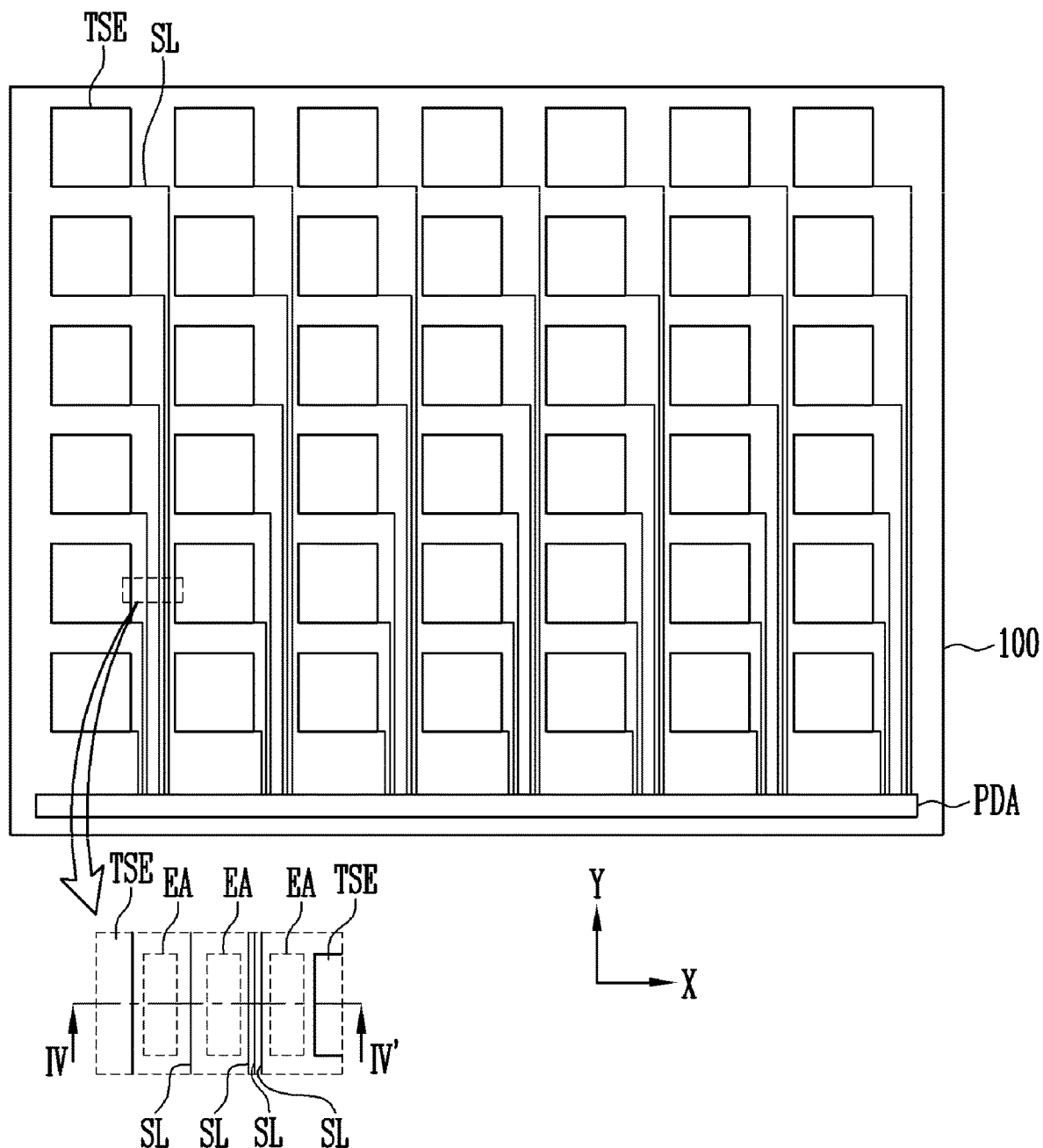
FIG. 9 is a plan view of the touch sensor disposed on a display panel of FIG. 8.

FIG. 8 is a schematic exploded perspective view of a display device having a touch sensor according to still another embodiment of the present inventive concept, and FIG. 9 is a plan view of the touch sensor disposed on a display panel of FIG. 8.

As illustrated in FIGS. 8 and 9, the touch sensor 200 is disposed on the display panel 100, and the touch sensor 200 includes a plurality of sensing electrodes TSE and a plurality of sensing lines SL connected one-to-one to the respective sensing electrodes TSE. In this case, capacitances of the respective sensing electrodes TSE are changed by touch of a user, and the touch sensor 200 may find a location of touch.

A plurality of sensing electrodes TSE may be arranged in the first direction X and the second direction Y, and each of the sensing electrodes TSE may be connected to the pad portion PDA through the sensing line TS extending in the second direction Y. Areas of the plurality of sensing electrodes TSE may be the same such that touch sensitivities of the plurality of sensing electrodes TSE are the same.

The sensing electrodes TSE may be formed of a transparent conductive material such as indium tin oxide (ITO), indium zinc oxide (IZO) or the like or may be formed of a non-transparent conductive material such as molybdenum (Mo), silver (Ag), titanium (Ti), copper (Cu), aluminum (Al) or the like.

The sensing electrodes TSE and the sensing lines SL may have the mesh structure in the same manner as in the above-described embodiments in order to minimize an overlapping area of a path of the light emitted from each pixel PXL of the display panel 100 and the sensing electrodes TSE.

However, because the sensing electrodes TSE corresponds one-to-one to the sensing lines SL in the structure described above, the number of the sensing lines SL increases as the number of the sensing electrodes TSE increases. Therefore, there is a limit to increase areas of the sensing electrodes TSE in order to secure a space for disposing the sensing lines SL. Accordingly, the areas of the sensing electrodes TSE or the number of the sensing electrodes TSE may be increased by disposing the sensing lines SL to be adjacent to each other.

To this end, in the display device according to another embodiment of the present inventive concept, at least two sensing lines SL are disposed side by side above one pixel defining layer PDL disposed between the light emitting regions EA of the adjacent pixels (see PXL of FIG. 8) of the display panel 100. For example, when n (n is a natural number larger than or equal to 2) sensing electrodes TSE are arranged in the second direction Y, n sensing lines SL may be arranged above the pixel defining layer PDL between the light emitting regions EA adjacent to each other.

Figure 10A:
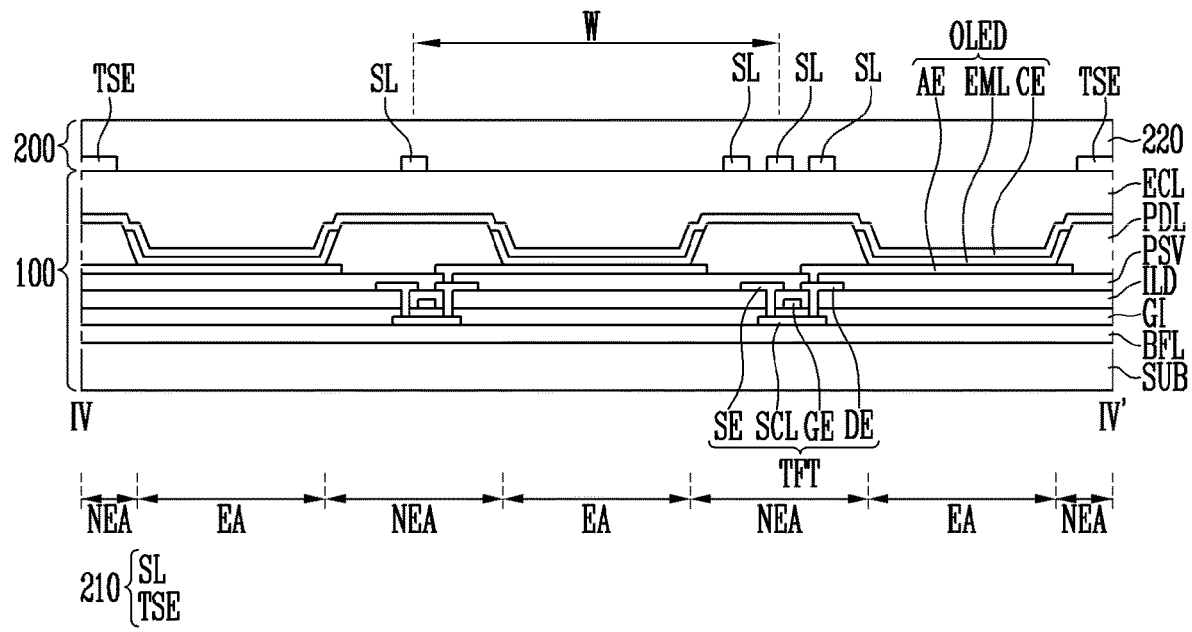
FIG. 10A is a cross-sectional view taken along a line IV-IV' of FIG. 10A.

FIG. 10A is a cross-sectional view taken along a line IV-IV' of FIG. 9.

As illustrated in FIG. 10A, the touch sensor 200 is disposed on the display panel 100. At this time, since the display panel 100 is the same as the above-described embodiment, description thereof will be omitted.

The touch sensor 200 disposed on the display panel 100 includes an electrode layer 210 including a plurality of sensing electrodes TSE and a plurality of sensing lines SL connected to the plurality of sensing electrodes TSE, and a cover layer 220 disposed on the electrode layer 210.

The plurality of sensing lines SL are arranged above the pixel defining layer PDL of the display panel 100 so as not to obstruct a path of the light emitted from the display panel 100, and expose the light emitting regions EA of the pixels (see PXL of FIG. 8). Specifically, the sensing lines SL overlap the pixel defining layer PDL with the capping layer ECL of the display panel 100 interposed therebetween.

Two or more sensing lines SL may be arranged side by side above the one pixel defining layer PDL, and the figure illustrates that three sensing lines SL are arranged above the one pixel defining layer PDL disposed between adjacent light emitting regions of adjacent pixels.

In general, because each sensing line SL is disposed above the pixel defining layer PDL disposed between the pixels (see PXL of FIG. 8) or the adjacent pixels (see PXL of FIG. 8), six sensing lines SL connected to the six sensing electrodes TSE arranged side by side in the second direction Y are spaced apart from each other by the width W of each pixel PXL. However, according to another embodiment of the present inventive concept, because the six sensing lines SL are arranged above the pixel defining layer PDL by three, three pixels (see PXL of FIG. 8) may be disposed between the adjacent sensing electrodes TSE in the first direction X.

Therefore, in the touch sensor 200, an interval between the sensing lines SL may be reduced and the sensing electrodes TSE may be formed closer to each other, and thereby, it is possible to increase the number of sensing electrodes TSE and to widen areas of the sensing electrodes TSE.

Figure 10B:
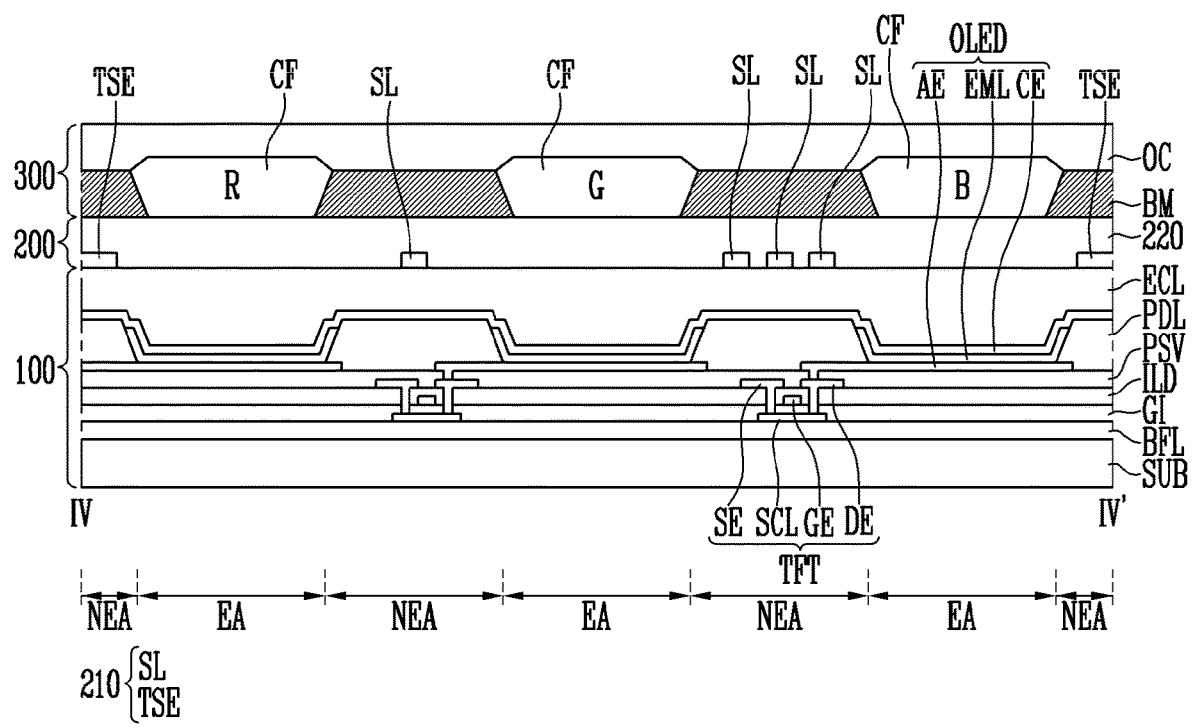
FIG. 10B is a view of FIG. 10A to which a color filter is added.

FIG. 10B is a cross-sectional view taken along a line IV-IV' of FIG. 9 to which a color filter is added.

As illustrated in FIG. 10B, when the color filter layer 300 is disposed on the touch sensor 200, the color filter layer 300 is directly formed on the touch sensor 200 without an additional substrate interposed between the color filter layer 300 and the touch sensor 200, and thereby, a process may be simplified and cost may be saved.

When the display device includes the color filter layer 300 as described above, the sensing lines SL of the touch sensor 200 are disposed between the pixel defining layer PDL disposed between the adjacent pixels (see PXL of FIG. 8) of the display panel and the black matrix BM of the color filter layer 300, and at least two sensing lines SL of the touch sensor overlap an area where the pixel defining layer PDL and the black matrix BM overlap.

What is claimed is:

1. A display device comprising:
a display panel which includes a plurality of pixels, each of the plurality of pixels including a light emitting region defined by a pixel defining layer; and
a touch sensor which is disposed on one surface of the display panel and includes a plurality of sensing electrodes and a plurality of sensing lines connected to the plurality of sensing electrodes,
wherein the plurality of sensing electrodes include a plurality of first sensing electrode strings and a plurality of second sensing electrode strings alternately arranged in a first direction,
wherein the plurality of first sensing electrode strings are arranged in a second direction different from the first direction and include a plurality of first sensing electrodes connected to a plurality of first sensing lines of the plurality of sensing lines,
wherein the second sensing electrode strings are arranged in the second direction and include a plurality of second sensing electrodes connected to a plurality of second sensing lines of the plurality of sensing lines, and
wherein at least two of the plurality of first sensing lines are disposed between light emitting regions adjacent to each other and spaced apart from each other side by side.

2. The display device of claim 1, wherein the plurality of sensing lines are disposed above the pixel defining layer to overlap the pixel defining layer in a plan view.

3. The display device of claim 2, wherein the plurality of sensing lines overlap the pixel defining layer with a capping layer of the display panel interposed between the pixel defining layer and the plurality of sensing lines.

4. The display device of claim 1,
wherein the plurality of first sensing electrodes include a plurality of subelectrodes arranged in the second direction, and
wherein the j-th (j is a natural number smaller than or equal to n) sub-electrode and n−j+1-th sub-electrode among the plurality of first sensing electrodes are electrically connected to each other through one of the plurality of first sensing lines.

5. The display device of claim 4, wherein the number of the plurality of first sensing electrodes included in the first sensing electrode string is equal to the number of the second sensing electrodes included in the second sensing electrode string.

6. The display device of claim 4, wherein the number of the plurality of first sensing electrodes included in the first sensing electrode string is different from the number of the second sensing electrodes included in the second sensing electrode string.

7. The display device of claim 4, wherein two or more of the plurality of first sensing lines or two or more of the second sensing lines overlap the pixel defining layer disposed between the light emitting regions adjacent to each other.

8. The display device of claim 4, wherein two or more of the plurality of first sensing lines or two or more of the second sensing lines overlap the pixel defining layer disposed between the light emitting regions adjacent to each other.

9. The display device of claim 1, wherein the plurality of sensing electrodes have the same area and each of the plurality of sensing electrodes is connected one-to-one to the plurality of sensing lines.

10. The display device of claim 9,
wherein the plurality of sensing electrodes are arranged in a first direction and in a second direction different from the first direction, and
wherein the plurality of sensing electrodes are connected to pads in a pad portion through the plurality of sensing lines extending between the plurality of sensing electrodes disposed adjacent to each other.

11. The display device of claim 9, wherein when n sensing electrodes are arranged in the second direction, a maximum of n sensing lines are arranged between the light emitting regions adjacent to each other.

12. The display device of claim 1, further comprising:
a color filter layer disposed on the touch sensor,
wherein the color filter layer includes
a black matrix that exposes the light emitting region; and
a color filter overlapping the light emitting region exposed by the black matrix.

13. The display device of claim 12, wherein the black matrix overlaps the pixel defining layer and the sensing lines.

14. A display device comprising:
a display panel which includes a plurality of pixels, each of the plurality of pixels including a light emitting region defined by a pixel defining layer; and
a touch sensor which is disposed on one surface of the display panel,
wherein the touch sensor includes
a plurality of first sensing electrode strings including a plurality of first sensing electrodes which are arranged in a first direction and connected to a plurality of first sensing lines, respectively; and
a plurality of second sensing electrode strings that include a plurality of second sensing electrodes arranged in the first direction and connected to a plurality of second sensing lines, wherein the plurality of first sensing electrode strings and the plurality of second sensing electrode strings are alternately arranged along a second direction different from the first direction, wherein the plurality of first sensing electrodes include a first plurality of subelectrodes arranged in the first direction and connected to different first sensing electrodes of the plurality of first sensing electrode, respectively, wherein the first plurality of sub-electrodes are connected to a second plurality of sub-electrodes disposed adjacent to the first plurality of sub-electrodes in a first direction through the plurality of first sensing lines, wherein a distance between the plurality of first sensing lines adjacent to each other is different from a distance between the second sensing lines adjacent to each other, wherein the plurality of sensing electrodes form capacitive elements and the plurality of sensing lines provide electrical connectivity for the capacitive elements, and wherein at least two of the plurality of first sensing lines are disposed between light emitting regions adjacent to each other and spaced apart from each other side by side.

15. The display device of claim 14, wherein the distance between the plurality of first sensing lines adjacent to each other is less than the distance between the second sensing lines adjacent to each other.

16. The display device of claim 15, wherein two or more of the plurality of first sensing lines adjacent to each other are spaced apart from two or more of the plurality of first sensing lines adjacent to each other by the light emitting regions.

17. The display device of claim 15, wherein the second sensing lines adjacent to each other are spaced apart from each other by the light emitting regions adjacent to each other.

18. The display device of claim 14, wherein the j-th (j is a natural number smaller than or equal to n) sub-electrode of the plurality of first sensing electrodes adjacent to each other is electrically connected to the n−j+1-th sub-electrode through one of the plurality of first sensing lines.

19. A display device comprising:
a display panel; and
a touch sensor disposed on a surface of the display panel and including first and second linear arrays of first and second sensing electrodes, respectively, the first linear array arranged parallel and adjacent to the second linear array; and
first, second, and third sensing lines electrically connecting first, second, and third sets of sub-electrodes of the first sensing electrodes,
wherein the first sensing line electrically connects first, second, and third sub-electrodes of the first, second, and third sets of the first sensing electrodes, respectively,
wherein the second sensing line electrically connects fourth, fifth, and sixth sub-electrodes of the first, second, and third sets of the first sensing electrodes, respectively,
wherein the third sensing line electrically connects seventh, eighth, and ninth sub-electrodes of the first, second, and third sets of the first sensing electrodes, respectively, and
wherein the first, second, and third sensing lines lie in a plane and do not intersect.

* * * * *